(12) United States Patent
Baumgartner et al.

(10) Patent No.: US 6,449,752 B1
(45) Date of Patent: Sep. 10, 2002

(54) DIGITAL CIRCUIT VERIFICATION WITH AUTOMATED SPECIFICATION ENUMERATION

(76) Inventors: Jason Raymond Baumgartner, 14936 Purslane Meadow Trail, Austin, TX (US) 78728; Nadeem Malik, 8217 Crabtree Dr., Austin, TX (US) 78750; Steven Leonard Roberts, 6103 Diamond Head Dr., Austin, TX (US) 78746

( * ) Notice: Subject to any disclaimer, the term of this patent is extended or adjusted under 35 U.S.C. 154(b) by 0 days.

(21) Appl. No.: 09/404,278

(22) Filed: Sep. 23, 1999

(51) Int. Cl.[7] .............................................. G06F 17/50
(52) U.S. Cl. ........................................................... 716/5
(58) Field of Search ............................. 717/4; 345/763; 716/5, 4, 6

(56) References Cited

U.S. PATENT DOCUMENTS 5,481,717 A * 1/1996 Gaboury ........................ 717/4
5,745,712 A * 4/1998 Turpin ........................ 345/763

* cited by examiner

*Primary Examiner*—Matthew Smith
*Assistant Examiner*—Thuan Do (57) ABSTRACT

A method for automatically generating a set of specifications against which a model of the digital circuit can be verified. In one embodiment, the method includes an initial step in which a specification class that corresponds to a type of behavior of the digital circuit is defined. A set of specification formulae that satisfies the defined specification class is then enumerated. Each formula in the set of formulae is then applied to the model of the digital circuit to determine whether the digital circuit satisfies the corresponding formula. The definition of the specification class preferably includes a set of input conditions, a set of output or response conditions, and a temporal component. Preferably, the enumeration of the specification formulae includes all specification formulae that satisfy the specification class. The application of the set of formulae to the model of the digital circuit is preferably achieved with a verification engine such as a model checker. Preferably, the specification formulae are expressed in temporal logic such as computational tree logic (CTL). In one embodiment the specification formulae are quantified such that the digital circuit satisfies a formula only if the formula always holds true. In another embodiment, the specification formulae are quantified such that the digital circuit satisfies the formula if the formula ever holds true. The preferred embodiment of the invention preferably includes displaying the results achieved by applying the specification formulae to the digital circuit models.

19 Claims, 6 Drawing Sheets

FIG 1

SPECIFICATION CLASS:
Values G1,G2 can assume 1 to 5 cycles — 201
after R1&R2 are asserted.

ENUMERATED SPECIFICATION FORUMLAE:
1) if R1=1 & R2=1, can G1=0 & G2=0 for T=1to 5
2) if R1=1 & R2=1, can G1=0 & G2=1 for T=1to 5
3) if R1=1 & R2=1, can G1=1 & G2=0 for T=1to 5
4) if R1=1 & R2=1, can G1=1 & G2=1 for T=1to 5

SPECIFICATION CLASS: — 301
Sequences G1,G2 can assume 1 and 2 cycles after
R1&R2 are asserted.

ENUMERATED SPECIFICATION FORMULAE:
1) if R1=1 & R2=1, can (G=00 for T=1) & (G=00 for T=2)
2) if R1=1 & R2=1, can (G=00 for T=1) & (G=01 for T=2)
3) if R1=1 & R2=1, can (G=00 for T=1) & (G=10 for T=2)
4) if R1=1 & R2=1, can (G=00 for T=1) & (G=11 for T=2)
5) if R1=1 & R2=1, can (G=01 for T=1) & (G=00 for T=2)
6) if R1=1 & R2=1, can (G=01 for T=1) & (G=01 for T=2)
7) if R1=1 & R2=1, can (G=01 for T=1) & (G=10 for T=2)
8) if R1=1 & R2=1, can (G=01 for T=1) & (G=11 for T=2)
9) if R1=1 & R2=1, can (G=10 for T=1) & (G=00 for T=2)
10) if R1=1 & R2=1, can (G=10 for T=1) & (G=01 for T=2)
11) if R1=1 & R2=1, can (G=10 for T=1) & (G=10 for T=2)
12) if R1=1 & R2=1, can (G=10 for T=1) & (G=11 for T=2)
13) if R1=1 & R2=1, can (G=11 for T=1) & (G=00 for T=2)
14) if R1=1 & R2=1, can (G=11 for T=1) & (G=01 for T=2)
15) if R1=1 & R2=1, can (G=11 for T=1) & (G=10 for T=2)
16) if R1=1 & R2=1, can (G=11 for T=1) & (G=11 for T=2)

| Formula 1 | Formula 2 | Formula 3 | . . . . | Formula N |

|  | Quantifier | Pass/Fail |
|---|---|---|
| SPECIFICATION FORMULA 1 | AG | P |
| SPECIFICATION FORMULA 2 | EF | P |
| SPECIFICATION FORMULA 3 | AG | F |
| . | | |
| . | | |
| . | | |
| SPEICIFICATION FORMULA N | AG | P |

DIGITAL CIRCUIT VERIFICATION WITH AUTOMATED SPECIFICATION ENUMERATION

BACKGROUND

1. Field of the Present Invention

The present invention relates to the field of digital circuit verification and more particularly to an efficient method for exploring behavior of a digital circuit in the absence of an adequate digital circuit specification.

2. History of Related Art

Digital circuit verification is the process of demonstrating proper behavior of a particular digital circuit implementation. An implementation is behaving properly if the implementation satisfies its specification. Verification is typically accomplished using either simulation or formal verification techniques. Simulation involves running specific tests on a model of the digital circuit implementation to verify proper behavior of the design under the specified test conditions. Formal verification is a process in which the correctness of a design is proven with a rigorous mathematical algorithm. Regardless of the verification technique used, a problem that is pervasive in all verification frameworks is the inability to perform effective verification in the absence of an adequate or comprehensive set of specifications for the circuit under test. If a specification with which the digital circuit under test must comply is missing from the set of specifications available to the verification engineer, no verification framework will be able to detect a violation of this specification. Unfortunately, the desire to reduce the design cycle time in an effort to get new products to market frequently makes it difficult, if not impossible, for the designer of the digital circuit to document a complete or even partial specification for the circuit. Without an adequate specification, the verification process slows significantly as the verification engineer must attempt to piece together a specification against which to test the circuit by simple trial and error and through interaction with the circuit designer. Therefore, it is highly desirable to implement a solution with which a specification for the circuit under test can be systematically and automatically generated such that their verification process would be less dependent on the existence of an adequate design specification. It would be further desirable if the implemented solution effectively shielded the verification process from the details of generating the formula necessary to apply to the digital circuit to derive the specification.

SUMMARY OF THE INVENTION

Broadly speaking, the present invention contemplates a method for automatically and systematically generating a set of specifications against which a model of the digital circuit can be verified. In one embodiment, the method includes an initial step in which a 'specification class' that corresponds to a type of behavior of the digital circuit is defined. A set of specification formulae that satisfies the defined specification class is then enumerated. Each formula in the set of formulae is then applied to the model of the digital circuit to determine whether the digital circuit satisfies the corresponding formula. The definition of the specification class preferably includes a set of input conditions, a set of output or response conditions, and a temporal component. Preferably, the enumeration of the specification formulae includes all specification formulae that satisfy the specification class. The application of the set of formulae to the model of the digital circuit is preferably achieved with a verification engine such as a model checker. Preferably, the specification formulae are expressed in temporal logic such as computational tree logic (CTL). In one embodiment the specification formulae are quantified such that the digital circuit satisfies a formula only if the formula always holds true. In another embodiment, the specification formulae are quantified such that the digital circuit satisfies the formula if the formula ever holds true. The preferred embodiment of the invention includes displaying the results achieved by applying the specification formulae to the digital circuit models.

The invention further contemplates a verification system including a graphical user interface for defining a specification class, a model checker or other suitable verification engine, and a wave form viewer. The user interface front-end allows users to define specification classes corresponding to a type of behavior of the digital circuit and then automatically enumerates a set of specification formulae that satisfy the behavior of interest. The enumerator may be implemented as a standalone module or alternatively, the enumerator may be integrated into an existing wave form editor. In the preferred embodiment, the wave form viewer comprises a back-end module of the user interface that allows users to view the results generated by the application of the specification formulae to the digital circuit model. The back-end module permits the user to view a list of the specification formulae generated for the defined specification class. The list preferably includes pass/fail information indicating whether the corresponding specification formula was exhibited or not. The back-end user interface may further include facilities for viewing actual wave form traces. In one embodiment, for example, the interface may include a set of tabs along the top of the viewing window. Each tab corresponds to one of the specification formula. Clicking on the tab for one of the specification formula then permits the viewer to explore the wave form generated on a cycle by cycle for per signal basis. In addition, the back-end user interface may include a tab for viewing a "witness" trace that provides an example of a given behavior or a "counter example" trace demonstrating when a given behavior was violated. The back-end GUI may further encompass a filtering technique for sub-categorizing the formulae in the specification class in which a hierarchical tab-based indexing is used to select between sub-categories. The back-end user interface further includes facilities for storing selected specifications in a storage facility referred to herein as a regression bucket.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Figure 1:
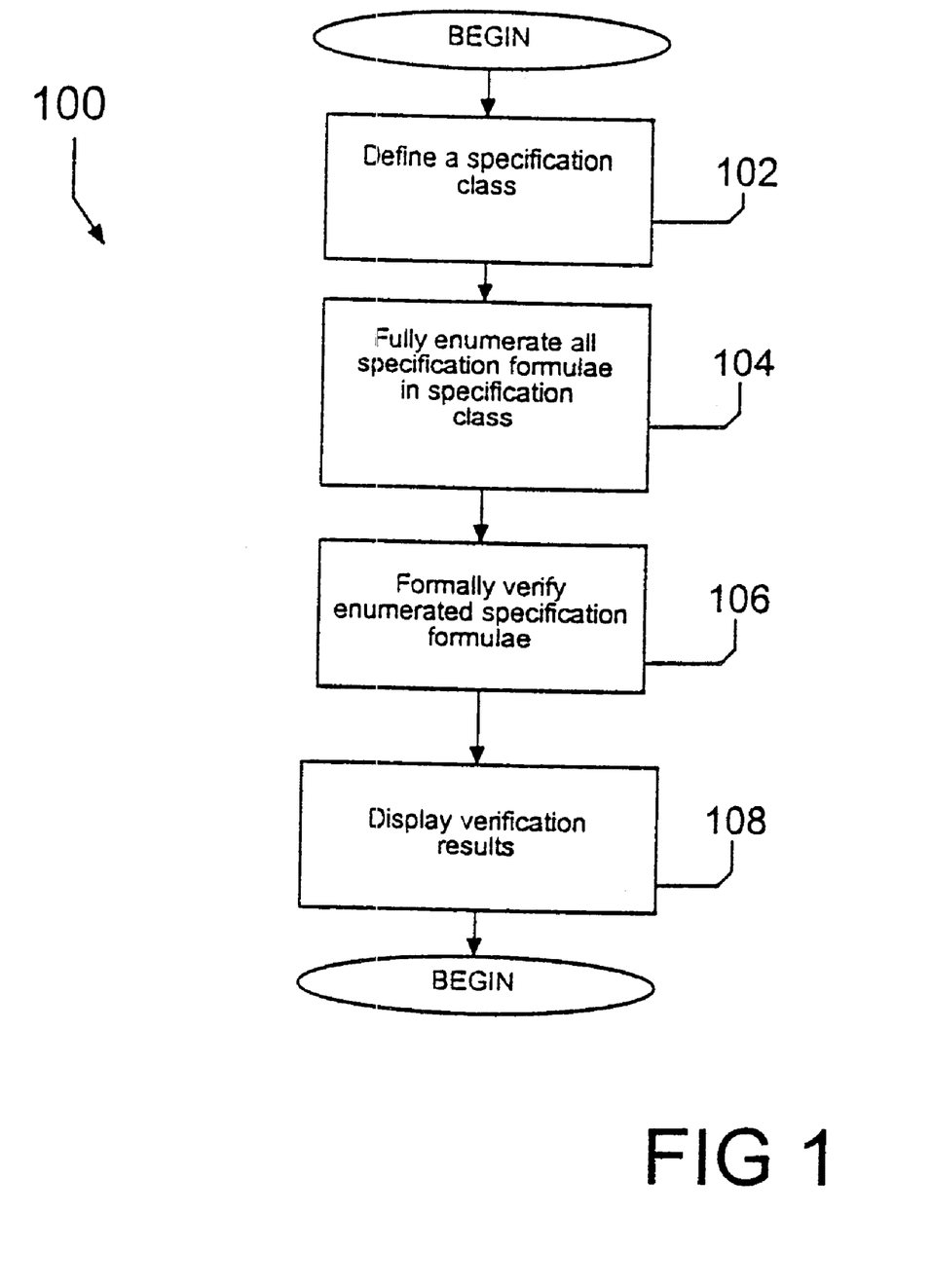
FIG. 1 is a flow diagram illustrating a verification method according to one embodiment of the invention.
Figure 5:
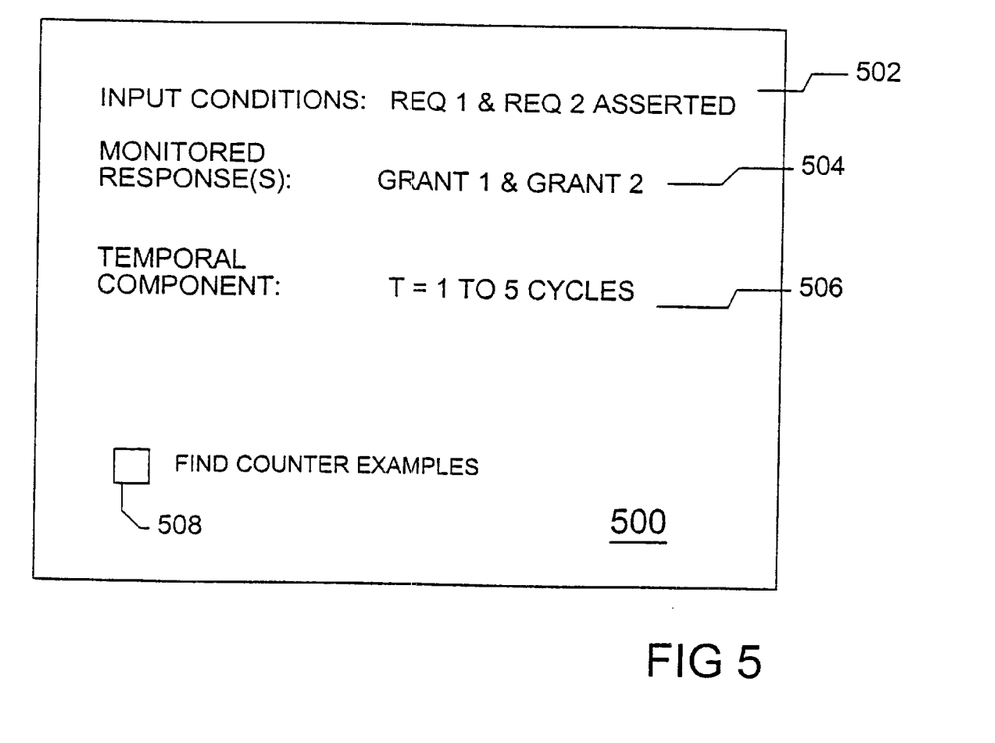
FIG. 5 illustrates features of a front-end of the user interface according to the present invention.

Turning now to the drawings, FIG. 1 is a simplified flow diagram illustrating a method 100 of verifying a digital circuit according to the present invention. Method 100 contemplates automating the process of generating specification formula to be applied to a digital circuit by a verification engine. Typically, the verification of a digital circuit is made difficult by the lack of an adequate specification against which the functionality of the circuit can be checked. In addition, changes to an existing design that may affect the design's "timing windows" (i.e. delays between inputs and events) are frequently undocumented. When a complete or adequate specification is unavailable, the verification cannot be initiated until an adequate specification is derived. In a conventional verification process, the necessary specification is frequently generated with a manually intensive process in which a verification engineer generates multiple specification formula and applies each of the formula to a model of the digital circuit. It will be appreciated by those in the field of circuit design and design verification that the prospect of manually generating specifications one-by-one against which to check the digital circuit can significantly increase the time and cost required to complete the verification. The present invention contemplates relieving verification engineers from this task and permitting them to spend more time exploring and generating specifications for the digital circuit by enabling the definition of a broad specification class and the automatic generation or enumeration of a complete set of specification formulae that satisfy the specification class. These formulae are then applied to a circuit model with a model checker or other suitable verification engine. The automated enumeration of specification formulae facilitates the discovery of a set of specifications that are applicable to the design and the exposure of subtle and typically undocumented changes in timing windows that occur when a design is changed. Method 100 includes the defining (step 102) of a specification class that corresponds to a type of behavior of interest to the verification engineer. In the preferred embodiment, the process of defining the specification class is facilitated by a suitably configured graphical user interface. In one embodiment, for example, the specification class is defined by a set of inputs, a set of responses, and a temporal component. As an example, a user may wish to discover what are the possible combination of values possible on output or response signals GRANT1 and GRANT2 at any time between one to five cycles after both REQUEST1 and REQUEST2 are asserted. Turning momentarily to FIG. 5, an illustration of a user interface screen 500 suitable for facilitating entry of specification classes according to the present invention is presented. In the depicted embodiment, display screen 500 is suitably configured for defining input conditions 502, monitored responses 504 and a temporal component 506. Entry of the specification classes with user interface screen 500 facilitates and expedites the process of generating a specification class by eliminating the need to define signal conditions for every signal in the device under test as is typical in many waveform-type editors. In the depicted embodiment, user interface 500 further includes a check box 508 for permitting the user to specify whether the user wishes to determine whether the digital circuit is merely capable of satisfying the defined specification or whether the digital circuit is guaranteed to always satisfy the defined circuit. Check box 508 permits users to specify whether they are interested in finding a "witness" trace or a counter-example trace (the default condition is witness trace in the depicted embodiment). If check box 508 is not checked, the verification engine that is ultimately employed to apply the specification formula to the digital circuit (as discussed in greater detail below) will exercise a model of the digital circuit until the specified condition is exhibited. In one embodiment, a copy of the trace that produced the specified behavior (the witness trace) is stored in memory for subsequent display in viewing by the user. If the digital circuit fails to exhibit the specified response after exhaustively exercising the digital circuit, a failure is recorded with respect to the corresponding specification formula. If check box 508 is checked, the user is interested in determining whether the digital circuit is guaranteed to exhibit the specified behavior. In this mode, the verification process is run until a counter example or failure of the specified condition is observed. Typically, this type of verification takes longer to execute than merely finding a witness trace. Since the exhaustive type of verification process is necessary to determine whether a specified behavior is always true with respect to the digital circuit, this option is available in one embodiment of the invention and is extremely useful for generating a regression bucket comprising a set of rules which are guaranteed to be true for the digital circuit. Typically, the specifications that are stored in a regression bucket are more informative if those specifications define conditions which are always true.

Figure 2:
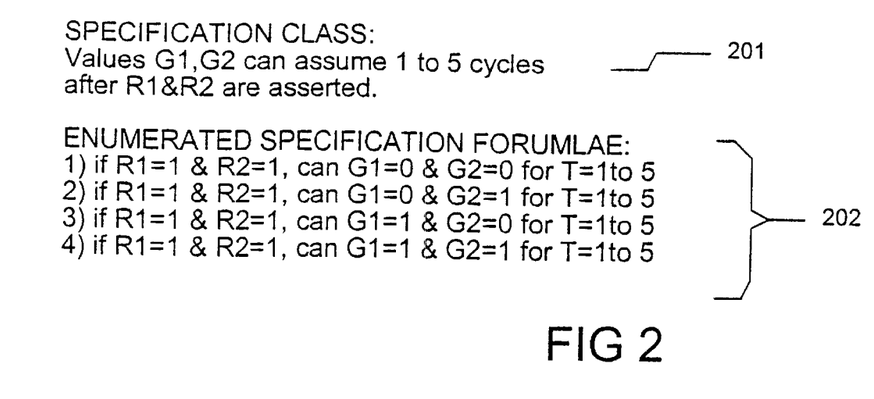
FIG. 2 illustrates an example of a set of specification formula satisfying a defined specification class according the present invention.
Figure 3:
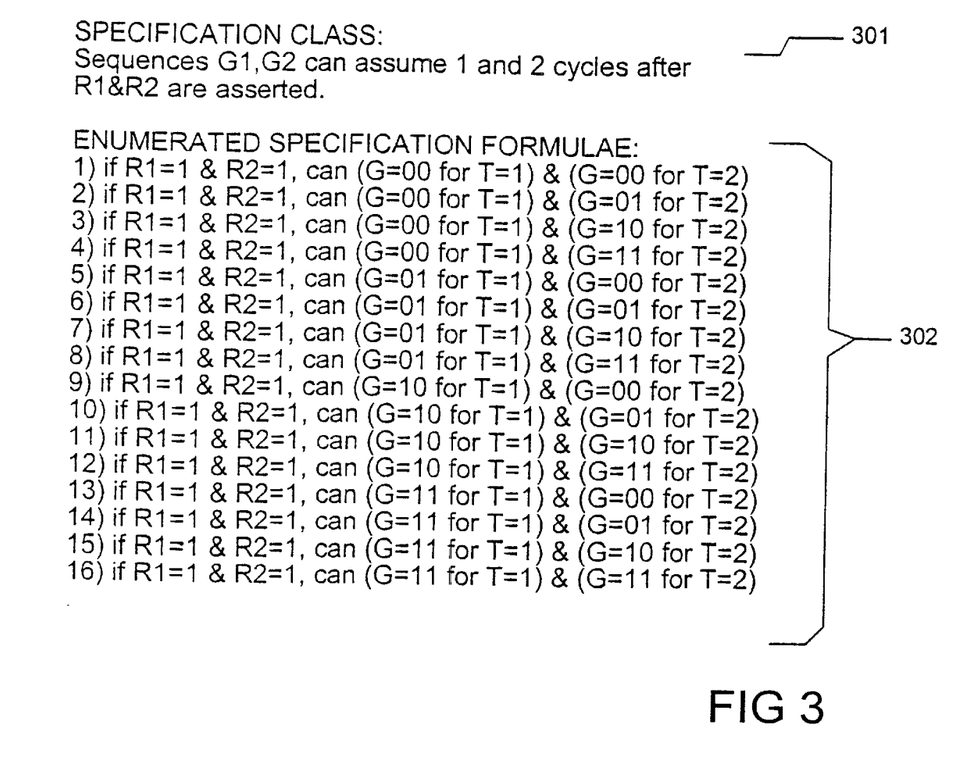
FIG. 3 illustrates a second example of a set of specification formula defined by a specification class that includes output sequenced conditions.

Returning now to FIG. 1, after the user defines a specification class in step 102, the specification class is enumerated (step 104). The enumeration process includes the generation of a set of specification formulae, which are specific or concrete examples of formula that satisfy the specification class defined in step 102. Preferably, the enumerated specification formulae are in a format usable by a verification engine such as a model checker. Turning momentarily to FIG. 2, an illustration of a set 202 of specification formulae enumerated in step 104 of method 100 is presented for the example given above in which the specification class 201 is defined as the possible states on GRANT1 and GRANT2 one to five cycles after REQUEST1 and REQUEST2 are asserted. In this example, set 202 includes a set of four specification formulae representing the four possible conditions on GRANT1 and GRANT2 one to five cycles after the specified input condition is encountered (in this case, the input condition where REQUEST1 and REQUEST2 are simultaneously asserted). Each specification formula 1 through 4 of the set 202 of specification formulae is sufficiently detailed for use with a model checker or other verification engine. In one embodiment, each of the specification formulae 202 is expressed in temporal logic such as computational tree logic (CTL) that is generally compatible with verification engines such as model checkers. Referring now to FIG. 3, an example of a set of specification formulae 302 is presented to illustrate an embodiment suitable for situations in which the user desires to specify a sequence of response conditions. The example depicted in FIG. 3 was generated in response to a specification class definition in which the class was defined as the sequence of values possible on GRANT1 and GRANT2 from one to two cycles after REQUEST1 and REQUEST2 are asserted. In this example, in which a set of two response signals are monitored for a sequence of two cycles, the enumeration in step 104 of method 100 of the specification class 301 results in the generation of 16 specification formulae. The 16 formulae of FIG. 3 represent all permutations of response conditions GRANT1 and GRANT2 in the two cycles after REQUEST1 and REQUEST2 are asserted. (In this illustration, the shorthand G=00 is used to convey that GRANT1=0 and GRANT2=0). It will be appreciated that the examples of FIG. 2 and FIG. 3 are greatly simplified for illustrative purposes and that typical specification classes that might be of interest can be significantly more complex. As the complexity of the specification class increases, it will be appreciated that the automated generation of all enumerated specification formulae defined by the specification class as provided in step 104 becomes of greater value. Consider, for example, a circuit behavior or specification class that when enumerated, generates hundreds of specification formulae. In the absence of an automated enumeration facility as contemplated herein, the verification engineer would have to manually generate each of the hundreds of specification formulae thereby effectively preventing, as a practical matter, the exploration or discovery of a large number of behaviors. This is particularly true in cases of circuit behaviors or specification classes involving a sequence of responses over multiple cycles as in the example of FIG. 3 because the number of enumerated specification formulae increases exponentially with the number of cycles under investigation. Thus, specification classes involving more than a trivial number of cycles are effectively undiscoverable without the automated generation of specification formulae as disclosed herein.

Returning now to FIG. 1, the specification formulae enumerated in step 104 are applied to a model of a digital circuit to formally verify (step 106) that the digital circuit satisfies the corresponding formulae. In the preferred embodiment, the set of formulae are applied to the digital circuit with a verification engine such as a model checker. In this embodiment, the model checker preferably includes an algorithm that enumerates all possible states of the model under test and any corresponding environment around the model to look for violations of the specification being applied. As indicated previously in the discussion of checkbox 508, a specification formula may be quantified with either "EF" (in CTL notation) in which case a model checker merely looks for an instance of behavior satisfying the formula or "AG" in which case the model checker merely looks for an instance of behavior that violates the formula. In the case of "EF" rules, the model checker records a witness trace illustrating the behavior and aborts if it is able to find one. If the model checker exhausts all possible states of the model/environment, the model checker reports a failure to indicate that the behavior specified in the formula was not reachable. In the case of "AG" rules the model checker prints a counter example of the specified behavior upon discovering one and, if it is not able to discover a counter example after exhaustively searching all states of the model/environment then the model checker records a "pass" meaning that the behavior specified by the formula was always true. The ability to quantify specification formulae with EF rules is useful in many cases because a witness trace of the specified behavior can be produced without fully enumerating all possible states of the design under test. In these cases, the specification formula under consideration can be retired as soon as the specified behavior is exhibited thereby resulting in a faster algorithm, as a rule of thumb, than attempting to enumerate all possible states of the circuit before checking the properties. Thus, EF rules permit the verification system to relatively quickly determine whether certain types of behaviors are reachable. On the other hand, the ability to quantify specification formulae with AG rules is useful in some cases because counter examples of the specified behavior may be exhibited relatively quickly thereby eliminating the need to enumerate the remaining states of the design under test. In addition, any specification formula quantified by AG that passes (i.e., exhibits the specified behaviors in all cases), can be extracted as a specification rule for the design under test. As more and more verification is achieved, this set of specification formulae that pass under AG constraints can be accumulated and stored in a "regression bucket", that substitutes for a formal design specification generated by the designer. The ability provided in the present invention to select between AG and EF rules maximizes the flexibility of the verification system.

Figure 4:
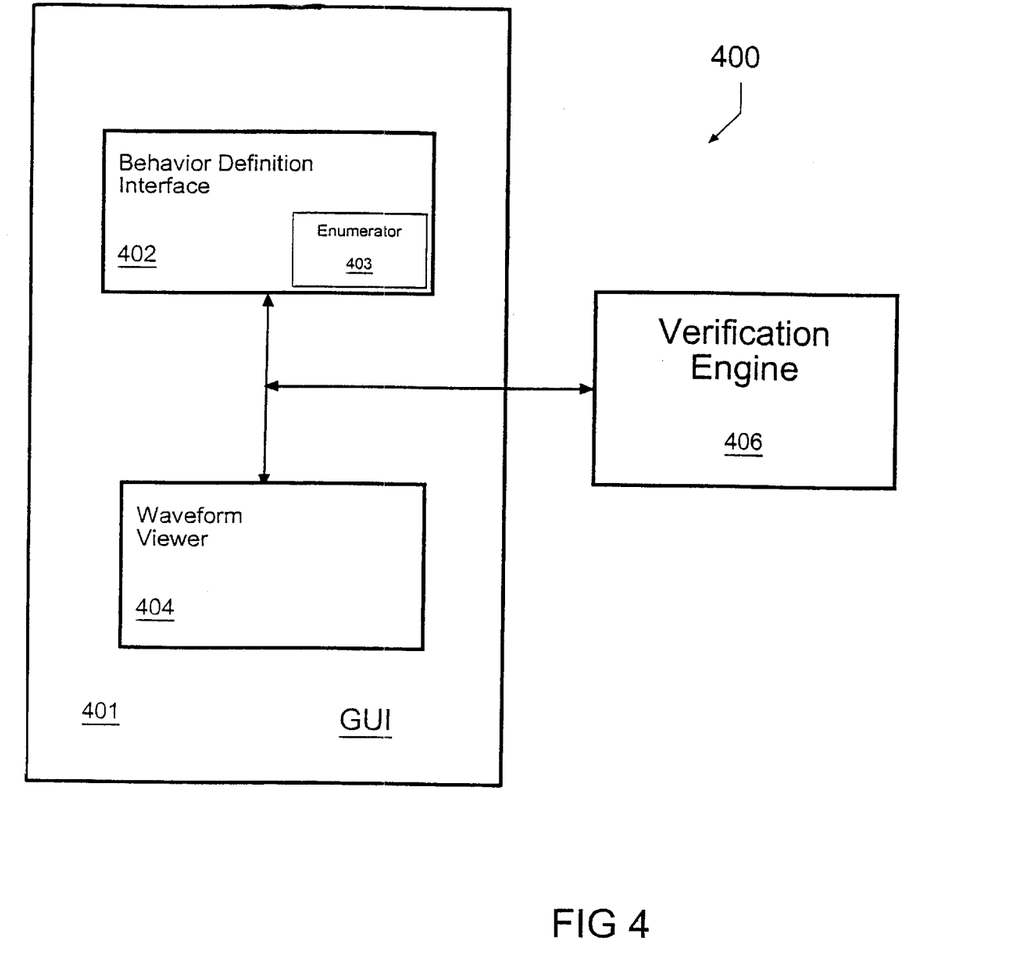
FIG. 4 is a simplified block diagram of a verification system including an user interface according to one embodiment of the present invention.

Turning now to FIG. 4, a simplified block diagram of one embodiment of a verification system 400 according to the present invention is presented. Verification system 400 includes a graphical user interface 401 that communicates with a verification engine 406 such as a model checker or a simulation module. User interface 401 includes a front-end in the form of a behavior definition interface 402 and a back-end in the form of a wave form viewer or browser 404. Behavior definition interface 402 includes facilities for defining the behavior of interest as discussed previously with respect to FIG. 5 to provide a user friendly interface that eliminates the difficult and repetitive task of entering large numbers of specification formulae manually. In addition, one embodiment of behavior definition interface 402 includes an enumerator 403 that interprets the specified behavior and generates a set of specification formulae. The specification formulae are in any format suitable for interpretation by verification engine 406 (such as CTL) and may include quantifiers such as EF or AG rules as discussed previously. The quantified formulae themselves are specified in a conventional manner using Boolean predicates, the specified variables and values, "X" (the temporal operator meaning "on the next cycle") and "F" (the temporal operator meaning "any cycle in the future"). For example, for the formulae "p->EX (q)" means "if p is presently true, is there any possible transition to a next state where q is true?"

Figure 6:
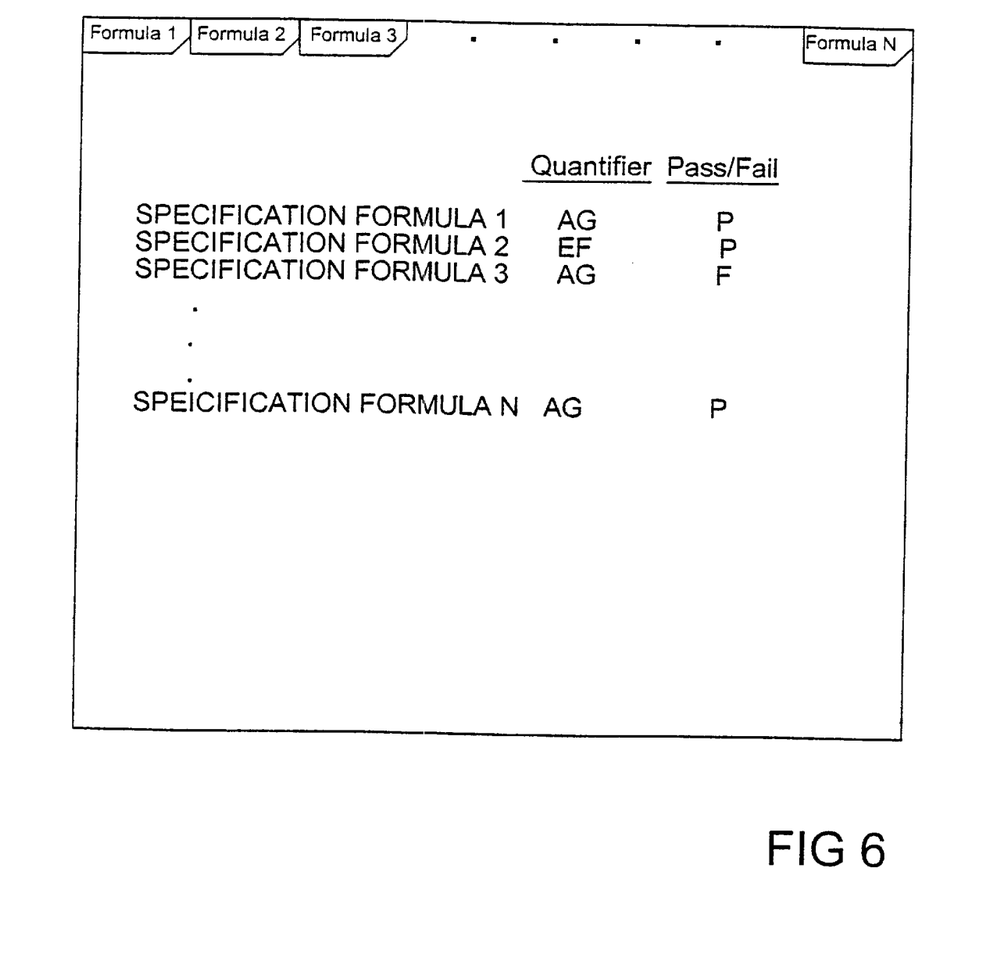
FIG. 6 illustrates features of a back-end user interface according to one embodiment of the present invention.

The depicted embodiment of user interface 401 further includes a waveform viewer 404 designed to facilitate viewing of results generated by applying the enumerated specification formulae to the digital circuit model. Waveform viewer 404 takes the set of results from verification engine 406 and presents the results in a format optimized for ease of browsing. Waveform viewer 404 enables the user to scroll through all of the enumerated behaviors to determine whether each behavior was exhibited or not. In the embodiment of viewer 404 illustrated in FIG. 6, the enumerated formulae are presented in the format of a list 600 including pass/fail information 602 for each formula indicating whether the specified behavior was exhibited or not. In addition, the depicted embodiment includes quantifier information 604 indicating whether the specified formula was applied using AG or EF type rules. To further facilitate viewing, the depicted embodiment of waveform viewer 404 includes a set of tabs 608 corresponding to each of the enumerated specification formulae. By clicking on the appropriate tab, the user can view witness or counter example traces of the corresponding specification formula. The waveform traces themselves can be further hierarchically arranged on a per-signal and/or per-cycle basis enabling the user to examine the waveform in greater detail. Using waveform viewer 404, the user may browse through the waveform traces to determine whether the digital circuit model is behaving in the expected fashion. In addition, viewer 404 may incorporate the ability to extract and store individual specification formulae. This ability is especially useful for accumulating AG type specifications that pass in a regression bucket as a means for effectively deriving the digital circuit's specifications when complete, formal specification documentation does not exist.

Figure 7:
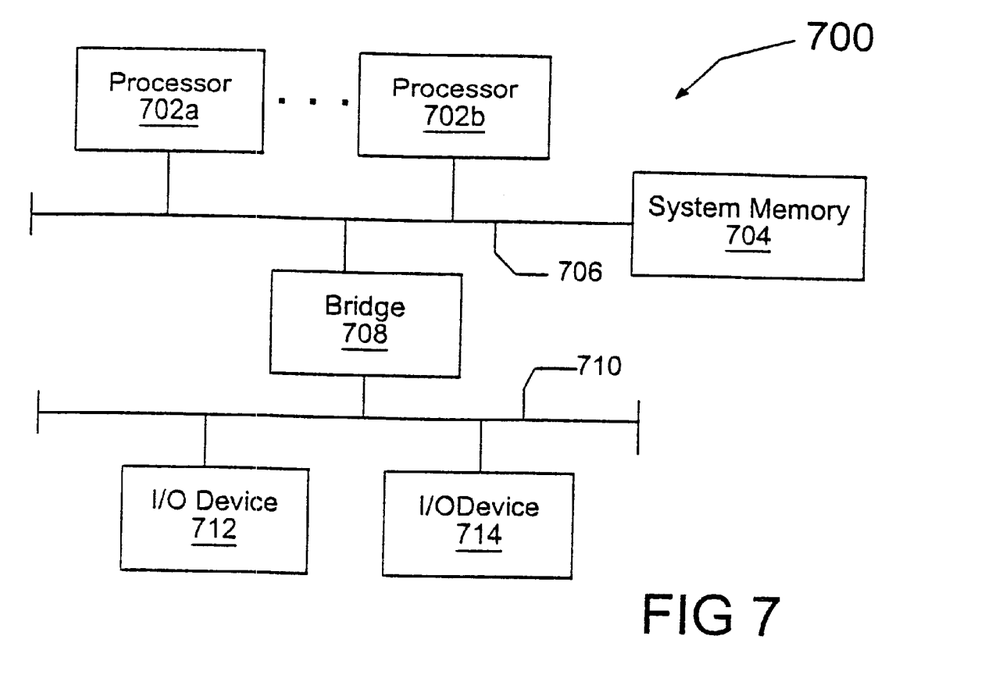
FIG. 7 illustrates a computer system suitable for implementing the verification system of the present invention.

Turning now to FIG. 7, a computer system 700 suitable for implementing the specification enumeration system and method described above is presented. Computer system 700 includes one or more processors indicated in FIG. 7 by reference numerals 702a and 702n (collectively or generically referred to herein as processor 702). Processor 702 may be compatible with any of a variety of commercially distributed processor families including, without limitation, the RS/6000 family of processors available from IBM Corporation, the PowerPC family of processors available from IBM Corporation, the 68000 family of processors available from Motorola, as well as x86 compatible family of processors available from a number of sources. In the embodiment depicted in FIG. 7, processor 702 communicates with a system memory 704 via a system bus 706. Thus, it will be appreciated by those familiar with microprocessor based computer design, that the depicted embodiment of computer system 100 is implemented as a symmetric multiprocessor (SMP) machine in which each processor 702 has essentially equivalent access to system memory 704. Alternative architectures in which computer system 700 may be implemented include non-uniform memory architectures (NUMA) systems in which the system memory is distributed such that each processor 702 has relatively inexpensive or fast access to a local portion of the system memory and slower or relatively more expensive access to the portions of system memory local to the remaining processors. The depicted embodiment of computer system 700 further includes one or more bridges 708 (only one of which is shown in the depicted embodiment) coupled between system bus 706 and I/O bus 710. Peripheral devices including an input device 712 and a display device 714 communicate with system bus 706 via the one or more bridges 708. Input device 712 may include, for example, a keyboard or pointing device such as a computer mouse. A wide variety of additional I/O devices, not depicted, are typically incorporated in computer system 700 including, for example, hard disk controllers, graphics adapters, high-speed network controllers, and audio adapters. I/O bus 710 may comply with any of a variety of industry standard I/O bus architectures including, as examples, the PCI, AGP, MCA, ISA, & EISA architectures. In addition, computer system 700 may include multiple I/O busses wherein a first I/O bus complies with one of the I/O bus architectures while a second bus is compliant with a second I/O bus architecture. One embodiment of the present invention is implemented as a set or sequence of encoded instructions suitable for execution by processors 702. The computer encoded instructions typically reside in system memory 704 when the computer instructions are being executed. Prior to being stored in system memory 704, the computer instructions may be encoded on any of a variety of other storage mediums including, as examples, a hard disk, a floppy disk device, a CD-ROM, or a DVD storage device. While the computer instructions may reside in a single computer system such as a computer system 700, another embodiment contemplates a network of systems similar to computer system 700 interconnected via a local area network or a wide area network.

It will be apparent to those skilled in the art having the benefit of this disclosure that the present invention contemplates a method of generating suitable specification formula for verifying a digital circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method of verifying a digital circuit comprising:
   defining a specification class comprising a set of input conditions, a set of output or response conditions, and a temporal component specifying a sequence of cycles;
   enumerating a set of specification formulae satisfying the specification class; and
   applying each of the set of formulae to a model of the digital circuit to determine whether the digital circuit satisfies the corresponding formula.

2. The method of claim 1, wherein the verification comprises a model checker.

3. The method of claim 1, wherein the specification formulae are expressed in temporal logic.

4. The method of claim 3, wherein the specification formulae are quantified such that the digital circuit satisfies the formula if the formula ever holds true.

5. The method of claim 3, wherein the specification formulae are quantified such that the digital circuit satisfies the formula only if the formula always holds true.

6. The method of claim 3, wherein further comprising displaying pass/fail results for each of the set of formulae.

7. A computer program product suitable for use with a data processing system including processor, memory, input means, and display means, the computer program comprising computer readable instructions for verifying a digital circuit; the encoded instructions comprising:
   behavior definition means for defining a specification class comprising a set of input conditions, a set of response conditions, and a temporal component specifying a sequence of cycles;
   enumeration means for enumerating a set of specification formulae satisfying the specification class; and
   means for invoking a verification engine to apply each of the set of formulae to a model of the digital circuit to determine whether the digital circuit satisfies the corresponding formula.

8. The computer program product of claim 7, wherein the verification engine comprises a model checker.

9. The computer program product of claim 7, wherein the specification formulae are expressed in temporal logic.

10. The computer program product of claim 9, wherein the specification formulae are quantified such that the digital circuit satisfies the formula if the formula ever holds true.

11. The computer program product of claim 9, wherein the specification formulae are quantified such that the digital circuit satisfies the formula only if the formula always holds true.

12. The computer program product of claim 7, wherein computer readable instructions further comprise means for displaying pass/fail results for each of the set of formulae.

13. A graphical user interface for use in verifying a digital circuit, comprising:

a behavior definition interface suitable for defining a specification class including a set of input conditions, a set of response conditions, and a temporal component specifying a sequence of cycles;

an enumerator configured to generate a set of specification formulae satisfying the specification class; and a waveform viewer adapted to display pass/fail results corresponding to the application of the set of specification formulae to the digital circuit.

14. The graphical user interface of claim 13 wherein the set of specification formulae generated by the enumerator are suitable for being received and interpreted by a verification engine.

15. The graphical user interface of claim 14, wherein the waveform viewer is configured to receive the pass/fail results from the verification engine.

16. The graphical user interface of claim 13, wherein the behavior definition interface includes facilities for quantifying a specification formula such that the digital circuit satisfies the formula if the formula ever holds true.

17. The graphical user interface of claim 13, wherein the behavior definition interface includes facilities for quantifying a specification formula such that the digital circuit satisfies the formula only if the formula always holds true.

18. The graphical user interface of claim 13, wherein the waveform viewer includes means for viewing witness traces and counter example traces corresponding to each specification formula.

19. The graphical user interface of claim 18, wherein the waveform viewer means include a set of selectable tabs, wherein each of the set of tabs corresponds to a specification formula such that a user may view witness or counter example traces of a desired specification formula by selecting the corresponding tab.

* * * * *